(12) United States Patent
Nakata et al.

(10) Patent No.: US 7,397,672 B2
(45) Date of Patent: Jul. 8, 2008

(54) FLIP CHIP MOUNTING SUBSTRATE

(75) Inventors: Yasukazu Nakata, Tokyo (JP);
Katsuyoshi Matsuura, Tokyo (JP);
Taiga Matsushita, Tokyo (JP)

(73) Assignee: Lintec Corporation, Tokyo (JP)

( * ) Notice: Subject to any disclaimer, the term of this patent is extended or adjusted under 35 U.S.C. 154(b) by 6 days.

(21) Appl. No.: 10/567,358

(22) PCT Filed: Jul. 30, 2004

(86) PCT No.: PCT/JP2004/011279

§ 371 (c)(1),
(2), (4) Date: Feb. 6, 2006

(87) PCT Pub. No.: WO2005/013360

PCT Pub. Date: Feb. 10, 2005

(65) Prior Publication Data

US 2006/0201703 A1    Sep. 14, 2006

(30) Foreign Application Priority Data

Aug. 5, 2003    (JP)    ............................. 2003-206098

(51) Int. Cl.
*H05K 1/02*    (2006.01)
*H05K 7/02*    (2006.01)

(52) U.S. Cl. ...................... 361/767; 361/737; 361/748; 361/760; 361/751; 361/736; 174/259; 174/260; 174/261; 235/488; 257/679

(58) Field of Classification Search ................ 361/737, 361/736, 748, 750, 751, 760, 771, 767; 174/250, 174/255, 260, 257; 235/488; 257/679
See application file for complete search history.

(56) References Cited

U.S. PATENT DOCUMENTS

| | | | | |
|---|---|---|---|---|
| 5,581,065 A | * | 12/1996 | Nishikawa et al. | 235/492 |
| 5,705,852 A | * | 1/1998 | Orihara et al. | 257/679 |
| 5,804,882 A | | 9/1998 | Tsukagoshi | |
| 6,160,526 A | * | 12/2000 | Hirai et al. | 343/895 |
| 6,173,898 B1 | | 1/2001 | Mande | |
| 6,252,777 B1 | * | 6/2001 | Ikeda et al. | 361/737 |
| 6,404,644 B1 | * | 6/2002 | Ikefuji et al. | 361/737 |
| 6,406,935 B2 | * | 6/2002 | Kayanakis et al. | 438/106 |
| 6,412,702 B1 | * | 7/2002 | Ishikawa et al. | 235/492 |
| 6,452,806 B2 | * | 9/2002 | Ikeda et al. | 361/737 |
| 6,469,371 B2 | * | 10/2002 | Akagawa | 257/679 |

(Continued)

FOREIGN PATENT DOCUMENTS

JP    2000-200332 A    7/1800

(Continued)

*Primary Examiner*—Diego Gutierrez
*Assistant Examiner*—Dameon E Levi
(74) *Attorney, Agent, or Firm*—Sughrue Mion, PLLC

(57) ABSTRACT

The present invention provides a flip chip mounting substrate which comprises an electronic circuit composed of a circuit line and plural mounting pads connected to both ends of the circuit line formed on one surface of a base sheet, wherein the plural mounting pads are faced each other and spaced a pad clearance gap apart, and one or more semiconductor mounting paste guide paths are formed in the mounting pads. The flip chip mounting substrate can reduce voids that might be produced in the semiconductor mounting paste, when flip-chip-mounting an IC chip on a flip chip mounting substrate.

2 Claims, 2 Drawing Sheets

U.S. PATENT DOCUMENTS

| | | | | |
|---|---|---|---|---|
| 6,552,422 | B1 * | 4/2003 | Schober | 257/679 |
| 6,631,847 | B1 * | 10/2003 | Kasahara et al. | 235/487 |
| 6,879,258 | B2 * | 4/2005 | Kuroda et al. | 340/572.1 |
| 7,168,623 | B1 * | 1/2007 | Royer | 235/492 |
| 2002/0030978 | A1 | 3/2002 | Kato | |

FOREIGN PATENT DOCUMENTS

| | | |
|---|---|---|
| JP | 10-313161 A | 11/1998 |
| JP | 2001-230274 A | 8/2001 |
| JP | 2002-64257 A | 2/2002 |
| WO | WO 95/19691 A1 | 7/1995 |

* cited by examiner

FLIP CHIP MOUNTING SUBSTRATE

FIELD OF THE INVENTION

The present invention relates to a flip chip mounting substrate which can reduce voids that might be produced in a semiconductor mounting paste, when flip-chip-mounting an IC chip on a flip chip mounting substrate.

DESCRIPTION OF THE PRIOR ART

Non-contact IC tags or non-contact IC cards have been used recently for personal certification, goods managements or physical distribution managements.

One of methods for production of an electronic circuit for the non-contact IC tags or the non-contact IC cards is a method which comprises mounting the IC chip to an electronic circuit substrate by flip-chip-mounting method (referenced to JP 2000-223534 A1).

The flip-chip-mounting method is a method which comprises sandwiching an anisotropic conductive paste between the IC chip and the electronic circuit substrate, and then pressing the IC chip to connect the IC chip to the electronic circuit substrate, when mounting the IC chip to the electronic circuit substrate. By the method, the pressed out anisotropic conductive paste is upheaved to form the fillet at the outside of the circumference of the mounted IC chip. Therefore, there is an advantage that it is possible to prevent permeation of moisture into the IC chip.

However, the method sometimes causes the curing of the anisotropic conductive paste at the state that gas such as air is left in the anisotropic conductive paste. There are problems that the voids cause imperfect contact, malfunction or crack of the IC chip.

DISCLOSURE OF THE INVENTION

In view of the problems of the prior art described above, the object of the present invention is to provide a flip chip mounting substrate which can reduce voids that might be produced in the semiconductor mounting paste, when flip-chip-mounting an IC chip on a flip chip mounting substrate.

As a result of efforts by the present inventors to solve the above-described problems, it was found that the problems described above are achieved by forming one or more semiconductor mounting paste guide paths for guiding the semiconductor mounting paste pressed out when the IC chip is connected to the mounting pad by pressing the IC chip to the mounting pad through the semiconductor mounting paste.

That is to say, the present invention provides a flip chip mounting substrate which comprises an electronic circuit composed of a circuit line and plural mounting pads connected to both ends of the circuit line formed on one surface of a base sheet, wherein the plural mounting pads are faced each other and spaced a pad clearance gap apart, and one or more semiconductor mounting paste guide paths are formed in the mounting pads.

The present invention also provides the flip chip mounting substrate as described above, wherein a width of the semiconductor mounting paste guide path is in the range from 50 to 600 μm.

The present invention also provides the flip chip mounting substrate as described above, wherein a broad section for pressing out and spreading uniformly the semiconductor mounting paste for connecting to an IC chip is formed in a part of the pad clearance gap.

The present invention also provides the flip chip mounting substrate as described above, wherein a thin film layer is formed in center section of the broad section.

In drawings, 1 means a base sheet, 2 means an electronic circuit, 3 means a circuit line, 4 means a mounting pad, 5 means an insulating layer, 6 means a jumper wiring portion, 7 means a pad clearance gap, 8 means a broad section, 9 means a semiconductor mounting paste guide path, 10 means a thin film layer, 11 means a guide mark, and 12 means a mounting position of IC chip.

DETAILED DESCRIPTION OF THE PREFERRED EMBODIMENTS

Figure 1:
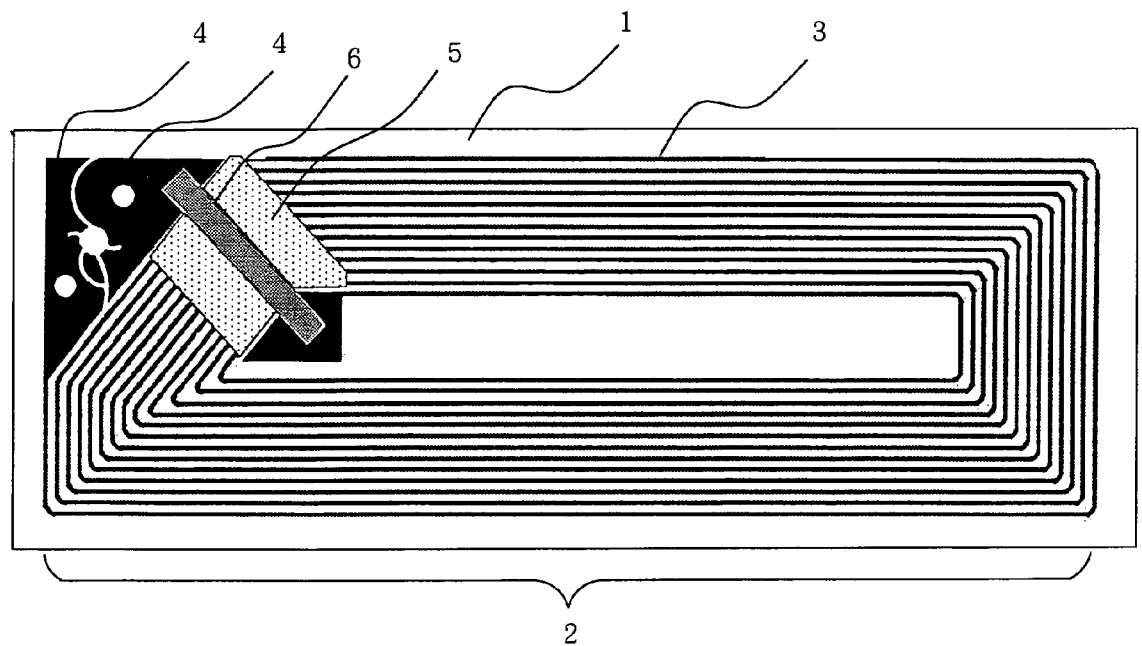
FIG. 1 shows a plane view of one embodiment in a flip chip mounting substrate of the present invention.
Figure 2:
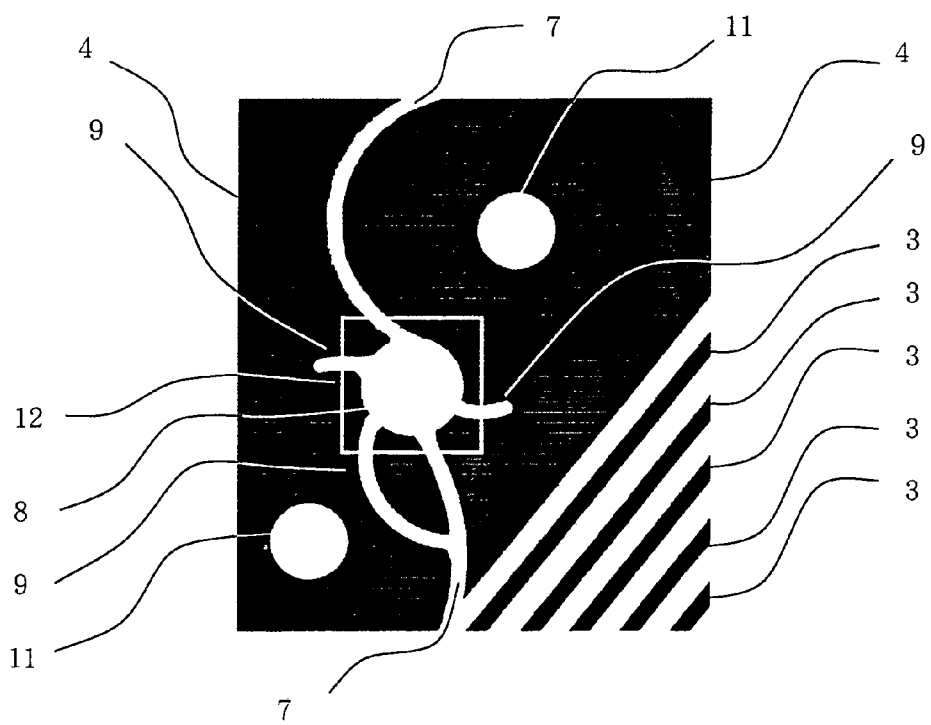
FIG. 2 shows an enlarged plane view of a part of the mounting pad of one embodiment in a flip chip mounting substrate of the present invention.

The flip chip mounting substrate of the present invention is explained based on the drawings. FIG. 1 shows a plane view of one embodiment in a flip chip mounting substrate of the present invention. FIG. 2 shows an enlarged plane view of a part of the mounting pad shown in FIG. 1.

In the present invention, an electronic circuit composed of a circuit line and plural mounting pads connected to both ends of the circuit line are formed on one surface of a base sheet. In FIG. 1, two mounting pads are formed.

The base sheet 1 is preferably a sheet composed of a synthetic resin.

As the sheet composed of the synthetic resin, for example, the sheets composed of one or more of various synthetic resins, such as polyolefin resins like high density polyethylene, middle density polyethylene, low density polyethylene, polypropylene, polymethyl-1-pentene/ethylene/cyclic olefin copolymer, and ethylene-vinyl acetate copolymer; polyester resins like polyethylene terephthalate, polyethylene naphthalate, polybutylene terephthalate; polyvinyl chloride resins; polyvinylalcohol resins; polycarbonate resins; polyamide resins; polyimide resins; fluororesins; copolymers containing two or more polymerization units thereof; polymer blends containing two or more resins thereof; polymer alloys containing one or more resins thereof can be used. Further, the sheets composed of a mixture of one or more of various synthetic resins and glass powder, titanium oxide powder or silica powder, and impregnated papers or glass fiber fabric can be used. In particular, the sheets composed of polyester resins are preferably used. The base sheet 1 can be oriented uniaxially or biaxially. The base sheet 1 can be composed of single layer or two or more layers of different layers or same layers.

Thickness of the base sheet 1 does not have any limitation. However, the thickness is usually in the range from 10 to 2000 μm and preferably in the range from 20 to 500 μm.

In the flip chip mounting substrate of the present invention, an electronic circuit 2 is formed on the surface of a base sheet 1.

The electronic circuit 2 comprises the circuit line 3 of conductive material. The preferable conductive materials include, for example, metals such as metallic foils, vapor deposition films and thin films produced by sputtering and conductive pastes containing metal particles dispersed in a binder. As the metals, gold, silver, nickel, copper, aluminium and the like can be used.

The average particle diameter of the metal particle is preferably in the range from 1 to 15 µm and more preferably in the range from 2 to 10 µm. The binder includes ultraviolet curable resins and thermosetting resins, and for example, ultraviolet curable resins and thermosetting resins such as polyester resins type, polyurethane resins type, epoxy resins type and phenol resins type.

The content of the metal particle is preferably in the range from 20 to 99% by mass, more preferably in the range from 50 to 99% by mass, and most preferably in the range from 70 to 99% by mass.

The shape of the electronic circuit 2 includes, for example, shapes indicated in FIG. 1. In FIG. 1, the electronic circuit 2 as an antenna is formed by arranging the circuit line 3 composed of a line of conductive material in tridecatet ring having specific space between each lines in the inside direction from the outside circumference of a rectangle base sheet 1 to the inside.

Thickness of circuit line 3 forming the electronic circuit 2 does not have any limitation. However, if the circuit line 3 is composed of the metallic foil, the thickness is preferably in the range from 5 to 50 µm. If the circuit line 3 is composed of the vapor deposition film or metallic film produced by sputtering, the thickness is preferably in the range from 0.01 to 5 µm. And, if the circuit line 3 is composed of the conductive paste, the thickness is preferably in the range from 5 to 100 µm.

The width of the circuit line 3 is not particularly limited, but is preferably in the range from 0.01 to 10 mm, more preferably in the range from 0.1 to 3 mm.

Usually, two mounting pads 4 for connecting to the IC chip is arranged to both ends of the circuit line 3. The mounting pads 4 can be formed inside of the circuit line 3 or outside of the circuit line 3.

In order to connect the circuit line 3 of the most outside ring or the most inside ring of the electronic circuit 2 to the mounting pads 4, the circuit line 3 of the most outside ring or the most inside ring of the electronic circuit 2 is connected to the mounting pads 4 by connecting to a jumper wiring portion 6 to form the line in direction of the inside or the outside of the circuit line 3, without short circuit (conduct) to the middle ring circuit line 3.

The jumper wiring portion 6 is a circuit formed over the middle ring circuit line 3 not to short circuit to the middle ring circuit line 3 for connecting the circuit line 3 of the most outside ring or the most inside ring of the electronic circuit 2 to the mounting pads 4. For achieving the object, an insulating layer 5 is usually formed between the jumper wiring portion 6 and the middle ring circuit line 3. The insulating layer 5 is composed of insulating material and preferably a cured product of curable insulating material. As curable insulating material, a curable insulating resin is preferable. The curable insulating resin include light curable insulating resins and thermosetting insulating resins. Examples of the insulating material include preferably insulating inks and more preferably light curable insulating inks such as ultraviolet curable insulating inks.

The jumper wiring portion 6 is composed of the same conductive material as the circuit line 3 and preferably conductive paste.

The preferable method for forming the jumper wiring portion 6 includes a method for forming the jumper wiring portion 6 by printing insulating material composed of insulating resin in line or plane crossing the section of the middle ring circuit line 3 from the circuit line 3 of the most outside ring and the most inside ring of the electronic circuit 2 forming the insulating layer 5 by drying or curing, and then printing conductive paste in line on the surface of the insulating layer 5 by screen printing or the like. The conductive paste includes that described before.

The jumper wiring portion 6 may be formed after forming the circuit line 3 on the surface of the base sheet 1. Also, after forming the jumper wiring portion 6 on the surface of the base sheet 1 beforehand and then forming the insulating layer 5 on the jumper wiring portion 6, the circuit line 3 may be formed as the mounting pad 4 and the end of the circuit line 3 of the most outside ring or the most inside ring are arranged at the position of the jumper wiring portion 6.

Two mounting pads 4 are faced each other and spaced a pad clearance gap 7 apart in the present invention.

The plane shape of the pad clearance gap 7 does not have any limitation, and can be various shapes such as straight line and curved line. Preferable shape of the curved line is curved lines having an average radius of circular arc from 1 mm to 10 mm.

The width of the pad clearance gap 7 can be a distance as the mounting pads 4 do not conduct and is usually in the range from 100 to 1500 µm, preferably from 200 to 1000 µm.

In a part of the pad clearance gap 7, a broad section 8 is preferably formed to apply the semiconductor mounting paste for connecting to an IC chip. The broad section 8 can fix the IC chip and the surface of the base sheet 1 rigidly with the semiconductor mounting paste, and prevent to remove the IC chip from the mounting pads 4.

The plane shape of the broad section 8 does not have any limitation, and include circle, ellipse and polygons such as triangle, quadrangle, hexagon and octagon, and preferably circle and ellipse. The size of the broad section 8 is preferably in the range from 10 to 80%, more preferably 15 to 75% and most preferably 20 to 70% of area of the mounting surface of the IC chip.

The thin film layer 10 is preferably formed in the center of the broad section 8. The formation of the thin film layer 10 having a symmetrical shape can promote to diffuse the pressed out semiconductor mounting paste uniformly, when the IC chip is connected to the mounting pad 4 by pressing the IC chip to the mounting pads 4 via the semiconductor mounting paste.

The plane shape of the thin film layer 10 does not have any limitation, and include circle, ellipse and polygons such as triangle, quadrangle, hexagon and octagon, and preferably circle and ellipse. The size of the thin film layer 10 is preferably in the range from 5 to 65% of area of the mounting surface of the IC chip.

The thickness of the thin film layer 10 is preferably the same as the mounting pad 4.

The thin film layer 10 can be made of various materials. But the thin film layer 10 can be preferably made of the same material as the mounting pad, because the thin film layer 10 can be formed at the same time with the formation of the mounting pad.

In the present invention, one or more semiconductor mounting paste guide paths 9 are formed in the mounting pads 4 for guiding the pressed out semiconductor mounting paste, when the IC chip is connected to the mounting pad 4 by pressing the IC chip to the mounting pad 4 via the semiconductor mounting paste.

The number of the semiconductor mounting paste guide paths 9 may be one, preferably two or more, and more preferably in the range from 2 to 6.

The semiconductor mounting paste guide paths 9 can be a groove which can flow the pressed out semiconductor mounting paste. The depth of the groove is preferably the same as the thickness of the mounting pad 4.

The semiconductor mounting paste guide paths 9 is preferably connected to the broad section 8. The width of the semiconductor mounting paste guide paths 9 can be usually from 50 to 600 μm, preferably from 100 to 500 μm. The length of the semiconductor mounting paste guide paths 9 can be 50 or more μm and usually 100 or more μm in the outside direction of the circumference of the IC chip, when mounting the IC chip. The upper limit of the length of the semiconductor mounting paste guide paths 9 can be the enough length to guide the semiconductor mounting paste and does not need the length of not less than the enough length. And, if the semiconductor mounting paste guide paths 9 hold a closed circuit structure of the electronic circuit 2 when the IC chip is mounted, the tip portion of the semiconductor mounting paste guide paths 9 can be connected to the pad clearance gap 7. Further, the guide mark 11 used for deciding the position of the IC chip can be formed in the mounting pad 4. The number of the guide mark 11 can be one, preferably two or more, and more preferably from 2 to 3.

In order to form the circuit line 3 of the electronic circuit 2, the mounting pad 4, the pad clearance gap 7, the broad section 8, the semiconductor mounting paste guide paths 9 and the guide mark 11 on the surface of the base sheet 1, there is, for example, a method which comprises laminating the metallic foil to the base sheet 1 with the adhesive layer, and etching the metallic foil to form the circuit line 3 of the electronic circuit 2, the mounting pad 4, the pad clearance gap 7, the broad section 8, the semiconductor mounting paste guide paths 9 and the guide mark 11. The etching treatment can be conducted by the same method as usual etching treatment. Also, the formation of the circuit line 3 of the electronic circuit 2 and the mounting pad 4 on the surface of the base sheet 1 can be conducted by applying the conductive paste in the shape of the circuit line 3 of the electronic circuit 2 and the mounting pad 4 by means of printing, applying or the like.

For increasing the adhesive strength between the base sheet 1 and the adhesive layer, the surface of the base sheet 1 can be surface-treated. The surface-treatment includes, for example, corona discharge treatment, chemical treatment, resin-coating and the like.

Adhesives used in the adhesive layer include various adhesives such as thermo melting adhesives, thermo plastic adhesives, pressure sensitive adhesives and thermosetting adhesives. The kinds of the adhesives include, for example, natural rubber adhesives, synthetic rubber adhesives, acrylic resin adhesives, polyester resin adhesives, polyvinyl ether resin adhesives, urethane resin adhesives and silicone resin adhesives.

Examples of the acrylic resin adhesives include homopolymers of monomer such as acrylic acid, methylacrylate, ethylacrylate, propylacrylate, butylacrylate, 2-ethylhexyl acrylate, methyl methacrylate, ethyl methacrylate, butyl methacrylate, and acrylonitrile, or copolymers of 2 or more of monomers thereof. Polyester resin adhesives include thermo plastic resin adhesives and thermosetting resin adhesives. Examples of the polyvinyl ether resin adhesives include polyvinyl ether, and polyvinyl isobutyl ether. Examples of the silicone resin adhesives include dimethyl polysiloxane. The adhesives can be used singly or in combination of two or more members.

Among the adhesives, the polyester resin adhesives are preferable.

A tackifier, a plasticizer, a softener, an antioxidant, a filler, a coloring agent such as a dye and a pigment or the like can be mixed in the adhesive layer, according to needs.

Thickness of the adhesive layer does not have any limitation. However, the thickness of the adhesive layer is usually in the range from 1 to 100 μm and preferably in the range from 3 to 50 μm.

Methods for forming the adhesive layer on the base sheet do not have any limitation, and various methods can be used. The methods include, for example, method which comprises applying by air knife coater, blade coater, bar coater, gravure coater, roll coater, curtain coater, diecoater, knifecoater, screen coater, Mayer bar coater, kiss coater or the like, and drying.

The mounting of IC chip to two mounting pads 4 of the flip chip mounting substrate can be conducted by a method which comprises applying the semiconductor mounting paste to the broad section 8 of the flip chip mounting substrate, forming the wire-bump by using a gold wire on the electrode portion of the IC chip, and optionally, deciding the position of the IC chip with the guide mark 11, and then heat-pressing the IC chip. The mounted position of the IC chip 12 is shown in FIG. 2.

The condition of the heat-pressing is usually at 100 to 300° C., under 100 to 400 gf, and for 1 second to 1 minute.

The thickness of the IC chip can be selected properly according to needs and usually in the range from 50 to 400 μm.

As the semiconductor mounting paste, anisotropic conductive pastes and non-conductive pastes can be used.

EXAMPLES

The present invention will be explained by examples more concretely in the next paragraph. In addition, the present invention was not restricted at all by these examples.

Example 1

Polyester type thermoplastic adhesive (produced by TOYOBO CO., LTD., trade name "VYLON 30SS") was applied by gravure coater on one surface of polyethylene terephthalate film (having abscissa length of 400 mm, ordinate length of 400 mm and thickness of 50 μm) of the base sheet 1 in an amount to form the dried thickness of 5 μm, to laminate the adhesive layer. Further, on the surface of the adhesive layer, an electrolytic copper foil having thickness of 35 μm was heated and pressed by heat seal roll of 100° C. Next, on the surface of the electrolytic copper foil, etching resist ink was printed in tridecatet and whirl-pool quadrangle ring of the circuit line 3 (antenna) having ordinate length of 16 mm and abscissa length of 47 mm in the most outside ring (having line width of 0.2 mm) and in two mounting pads 4 as indicated in FIG. 1, by screen printing method. The printed electrolytic copper foil was etching-treated with a solution of ferric chloride to remove the portion other than the circle circuit line 3 and two mounting pads 4. And then, the etching resist ink was removed with an alkali aqueous solution to form the electronic circuit 2 (having line width of the circuit line of 0.2 mm), the mounting pad 4 (having thickness of 35 μm), the pad clearance gap 7 (having width of 200 μm), the broad section 8 (having size of 37% to the mounting surface area of the IC chip and shape of roughly circle having diameter of 1 mm), the semiconductor mounting paste guide paths 9 (having depth of 35 μm and width of 200 μm and extended by 200 μm in straight line of outside direction from the circumference of the IC chip) and the guide mark 11, as shown in FIG. 1.

In order to conduct the circuit line 3 of the most inside ring of the electronic circuit 2 (antenna) and the mounting pad 4, an ultraviolet curable ink was printed to the space between them in roughly quadrangle and plane shape as shown in FIG. 1 by screen printing method. And then, ultraviolet light was irradiated for curing the ultraviolet curable ink to form the insulating layer 5 (having length of 7 mm, width of 5 mm and thickness of 20 μm) of the cured product of the ultraviolet curable ink. Next, a silver paste (average particle diameter of silver particle of 5 μm, silver particle content of 65% by mass, binder of thermosetting polyester resin) was printed in line shape of broad width on the surface of the insulating layer 5, and dried at 110° C. to form the jumper wiring portion 6 (having length of 10 mm, width of 1 mm and thickness of 23 μm). Plural flip chip mounting substrates were obtained.

Next, by using flip chip mounting machine (produced by KYUSHU MATSUSHITA ELECTRIC Co., Ltd., trade name of "FB30T-M"), the semiconductor mounting paste (produced by KYOCERA Chmeical Corporation., trade name "TAP0402E") was applied to the broad section 8 of the flip chip mounting substrate. A wire bump was formed at the electrode portion of an IC chip (produced by PHILIPS SEMICONDUCTORS, trade name of "I/CODE", having ordinate length of 1.45 mm, abscissa length of 1.45 mm and thickness of 150 μm) with a gold wire. The IC chip was connected to the mounting pads 4 by flip-chip-mounting of heat pressing in the condition at 220° C., under 200 gf and for 7 seconds. Thus, twenty of the IC chip-mounted substrate in which the fillet was formed at the outside of the circumference of the mounted IC chip, were prepared. The filet was formed uniformly at the outside of the circumference of the mounted IC chip. Void observation by visual was tried from the backside of the base sheet 1, but there were no voids.

The twenty IC chip-mounted substrates were confirmed to act as the electronic circuit by an electronic circuit evaluation kit (produced by PHILIPS SEMICONDUCTORS, trade name of "I/CODE EVALUATION KIT SLEV400"), and then, placed in an environment confirmation test machine (produced by ESPEC CORP., trade name "SH-241 type small environment test machine") for 1000 hours under heat and humidification of 60° C. and 90% RH. After the heat and humidification, the electronic circuit was left at room temperature for 24 hours. Again, the act confirmation as the electronic circuit was tried. As the result, there were no electronic circuits of malfunction among twenty IC chip-mounted substrates.

Example 2

Figure 3:
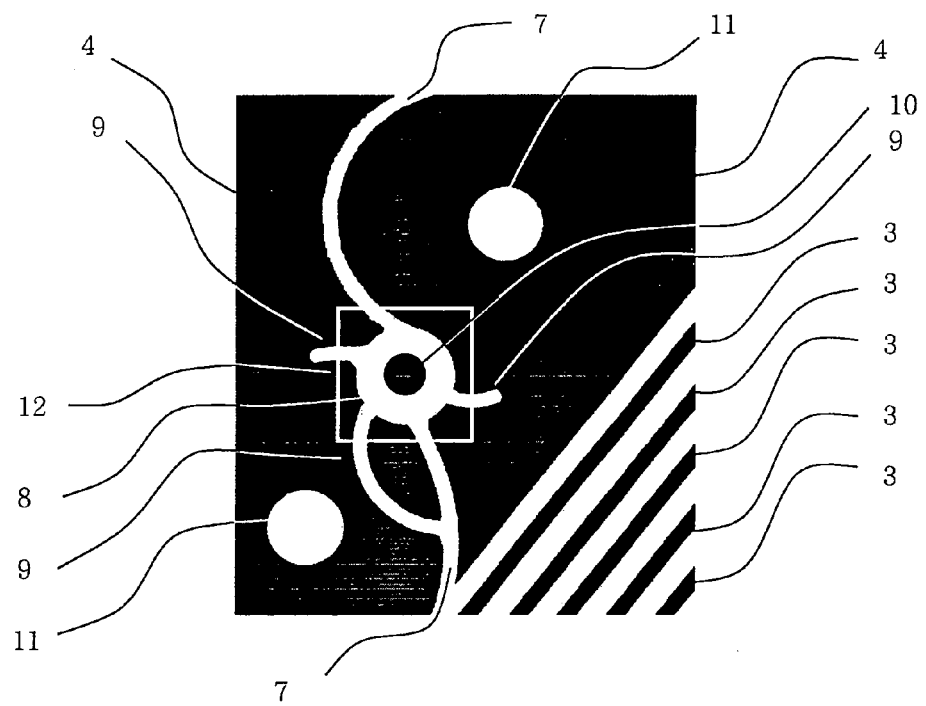
FIG. 3 shows an enlarged plane view of a part of the mounting pad of other one embodiment in a flip chip mounting substrate of the present invention.

The flip chip mounting substrate was prepared in the same method as described in Example 1 except that a thin film layer 10 of electrolytic copper foil (being a circle shape having a diameter of 0.7 mm and a size of 18% of area of the mounting surface of the IC chip) was formed by etching to the broad section 8 shown in FIG. 3. Next, twenty IC chip-mounted substrates were prepared in the same method as described in Example 1. The figure extruded with the semiconductor mounting paste at the outside of the circumference of the mounted IC chip was uniform than that of Example 1.

Further, the electronic circuit evaluations of twenty IC chip-mounted substrates were conducted in the same method as described in Example 1. The filet was formed uniformly at the outside of the circumference of the mounted IC chip. Void observation by visual was tried from the backside of the base sheet 1, but there were no voids. As the result of the electronic circuit evaluation, there were no electronic circuits of malfunction among twenty IC chip-mounted substrates.

Comparative Example 1

Figure 4:
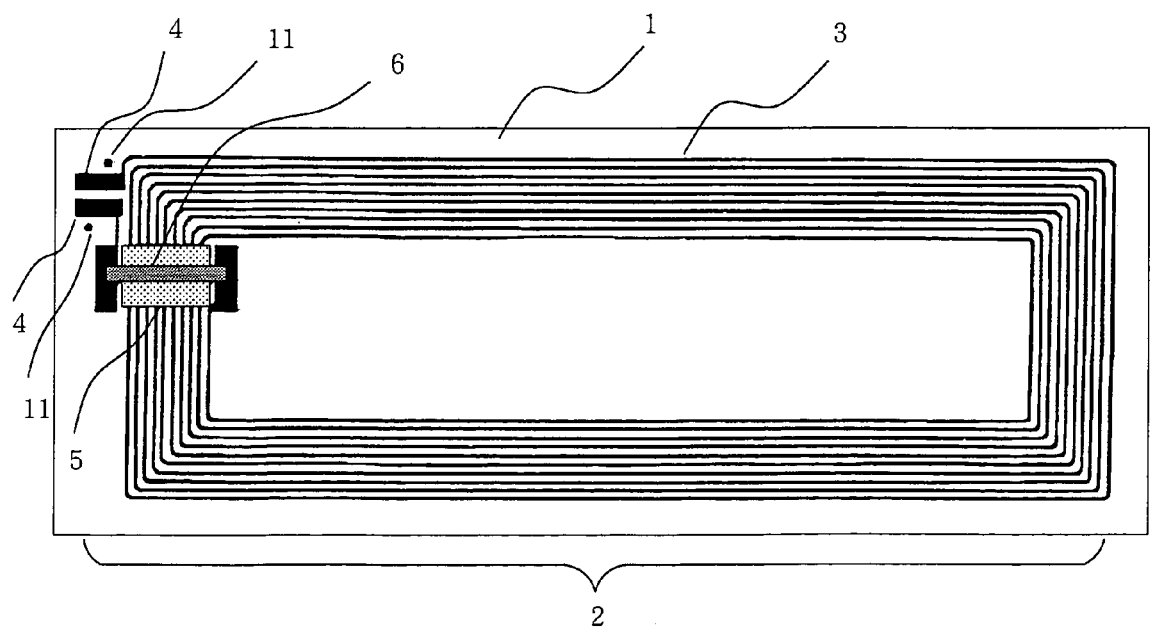
FIG. 4 shows a plane view of one embodiment in a prior flip chip mounting substrate.

The flip chip mounting substrates were prepared in the same method as described in Example 1 except that a mounting pad 4 without a semiconductor mounting paste guide path 9 as shown in FIG. 4 were used.

The IC chip-mounted substrates were prepared in the same method as described in Example 1.

Further, the electronic circuit evaluations of twenty IC chip-mounted substrates were conducted in the same method as described in Example 1. Void observation by visual was tried from the backside of the base sheet 1, and there were voids. As the result, there were ten electronic circuits of malfunction among twenty IC chip-mounted substrates.

The flip chip mounting substrate of the present invention can reduce voids that might be produced in the semiconductor mounting paste, when flip-chip-mounting an IC chip on a flip chip mounting substrate. And, the flip chip mounting substrate of the present invention can prevent the imperfect contact, the malfunction or the crack of the IC chip.

The invention claimed is:

1. A flip chip mounting substrate which comprises
   an electronic circuit composed of a circuit line and plural mounting pads connected to both ends of the circuit line formed on one surface of a base sheet,
   wherein the plural mounting pads face each other and are spaced a pad clearance gap apart;
   one or more semiconductor mounting paste guide paths are formed in the mounting pads;
   a broad section for pressing out and spreading uniformly the semiconductor mounting paste for connecting to an IC chip is formed in a part of the pad clearance gap; and
   a thin film layer is formed in a center section of the broad section.

2. The flip chip mounting substrate as claimed in claim 1, wherein a width of the semiconductor mounting paste guide path is in the range from 50 to 600 μm.

* * * * *